(12) United States Patent
Gopinath et al.

(10) Patent No.: US 12,432,936 B2
(45) Date of Patent: Sep. 30, 2025

(54) CAPACITOR INTEGRATED WITH MEMORY ELEMENT OF MEMORY CELL

(71) Applicant: GLOBALFOUNDRIES U.S. Inc., Malta, NY (US)

(72) Inventors: Venkatesh P. Gopinath, Fremont, CA (US); Joseph Versaggi, Saratoga Springs, NY (US); Gregory A. Northrop, Ballston Spa, NY (US); Bipul C. Paul, Mechanicville, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 653 days.

(21) Appl. No.: 17/847,776

(22) Filed: Jun. 23, 2022

(65) Prior Publication Data
US 2023/0422519 A1 Dec. 28, 2023

(51) Int. Cl.
*H10B 63/00* (2023.01)
*G11C 5/10* (2006.01)
*G11C 7/16* (2006.01)
*G11C 11/404* (2006.01)
*G11C 13/00* (2006.01)
*H10N 70/00* (2023.01)

(52) U.S. Cl.
CPC ............... *H10B 63/30* (2023.02); *G11C 5/10* (2013.01); *G11C 7/16* (2013.01); *G11C 13/0007* (2013.01); *G11C 13/003* (2013.01); *H10N 70/011* (2023.02); *G11C 11/404* (2013.01)

(58) Field of Classification Search
CPC .... H10B 63/22; H10B 63/30; G11C 13/0028; G11C 13/0026; G11C 13/0002; G11C 7/16; G11C 5/10; G11C 13/003; H10N 70/011
See application file for complete search history.

(56) References Cited

U.S. PATENT DOCUMENTS

| | | |
|---|---|---|
| 9,368,206 B1 | 6/2016 | Dinh et al. |
| 9,543,375 B2 | 1/2017 | Huang et al. |
| 2011/0031586 A1* | 2/2011 | Kang ............... H10D 1/68 257/532 |

OTHER PUBLICATIONS

Shen et. al., "A Novel Capacitor-based Stateful Logic Operation Scheme for In-memory Computing in 1T1R RRAM Array", 2020 4th IEEE Electron Devices Technology & Manufacturing Conference (EDTM), Sep. 2019, vol. 40, No. 9, Abstract, 2 pages.

Jiang et. al., "C3SRAM: An In-Memory-Computing SRAM Macro Based on Robust Capacitive Coupling Computing Mechanism", IEEE Journal of Solid-State Circuits, vol. 55, No. 7, Jul. 2020, 10 pages.

\* cited by examiner

*Primary Examiner* — Jose R Diaz
(74) *Attorney, Agent, or Firm* — Andrew M. Calderon; Calderon Safran & Wright P.C.

(57) ABSTRACT

The present disclosure relates to semiconductor structures and, more particularly, to a capacitor integrated with a memory element of a memory cell and methods of manufacture. The structure includes: at least one memory cell comprising a memory element with a top conductor material; and a capacitor connected to the memory element by the top conductor material.

19 Claims, 6 Drawing Sheets

CAPACITOR INTEGRATED WITH MEMORY ELEMENT OF MEMORY CELL

BACKGROUND

The present disclosure relates to semiconductor structures and, more particularly, to a capacitor integrated with a memory element of a memory cell and methods of manufacture.

Resistive random-access memory (ReRAM or RRAM) is a type of non-volatile (NV) random-access (RAM) computer memory that works by changing the resistance across a dielectric solid-state material, often referred to as a memristor. In a memristor, the dielectric breakdown is temporary and reversible because of the particular materials used as an insulator material. For example, RRAM involves generating defects in a thin oxide layer, known as oxygen vacancies (oxide bond locations where the oxygen has been removed), which can subsequently charge and drift under an electric field. The motion of oxygen ions and vacancies in the oxide is analogous to the motion of electrons and holes in a semiconductor. Accordingly, the basic idea is that a dielectric, which is normally insulating, can be made to conduct through a filament or conduction path formed after application of a sufficiently high voltage. Once the filament is formed, it may be reset (broken, resulting in high resistance) or set (re-formed, resulting in lower resistance) by another voltage.

An unformed RRAM bit is essentially a parallel plate capacitor due to the undamaged switching dielectric. An unformed RRAM cell also has an exponential dependence of forming time vs. forming voltage. For example, the combination of time under stress and voltage will determine the lifetime of the bit as a capacitor before it changes to a low resistance state. Illustratively, for example, at 500 mV at 100 ns stress time, a RRAM cell may handle approximately 1E15 "reads" before changing state.

SUMMARY

In an aspect of the disclosure, a structure comprises: at least one memory cell comprising a memory element with a top conductor material; and a capacitor connected to the memory element by the top conductor material.

In an aspect of the disclosure, a structure comprises: an array of memory cells each of which comprises a resistive memory element with a top conductive material and a capacitor connected to the resistive memory element by the top conductive material; and a sum line connecting to each capacitor in the array of memory cells.

In an aspect of the disclosure, a method comprises: forming at least one memory cell comprising a memory element with a top conductor material; and forming a capacitor connected to the memory element by the top conductor material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a capacitor integrated with a memory element of a memory cell and methods of manufacture. More specifically, the present disclosure relates to a capacitor combined with a resistive random-access memory (RRAM) design for analog in memory computation (ACiM). Advantageously, the present disclosure provides an optimized layout to meet ACiM circuit and architecture requirements with co-located RRAM, capacitor and logic.

In embodiments, the memory may be a Matrix Vector Multiplication (MVM) based array comprising a RRAM with a variable resistance element placed next to a capacitor, in series. The capacitor is compact, precise and tightly controlled, and can be easily integrated into a capacitor coupled ACiM array. In embodiments, the memory cell takes advantage of a top electrode conducting layer (e.g., TaSi, TaN, TiN, etc.) of the resistance element (e.g., top metal layer of the RRAM) to seamless connect two components, e.g., a capacitor and resistance element of the RRAM. More specifically, the layout seamlessly integrates the RRAM, capacitors and drive transistors into one compact element, with the dimensions and number of capacitors being capable of adjustment to obtain the required capacitance value for ACiM.

The integrated memory of the present disclosure can be manufactured in a number of ways using a number of different tools. In general, though, the methodologies and tools are used to form structures with dimensions in the micrometer and nanometer scale. The methodologies, i.e., technologies, employed to manufacture the integrated memory of the present disclosure have been adopted from integrated circuit (IC) technology. For example, the structures are built on wafers and are realized in films of material patterned by photolithographic processes on the top of a wafer. In particular, the fabrication of the integrated memory uses three basic building blocks: (i) deposition of thin films of material on a substrate, (ii) applying a patterned mask on top of the films by photolithographic imaging, and (iii) etching the films selectively to the mask. In addition, pre-cleaning processes may be used to clean etched surfaces of any contaminants, as is known in the art. Moreover, when necessary, rapid thermal anneal processes may be used to drive-in dopants or material layers as is known in the art.

Figure 1:
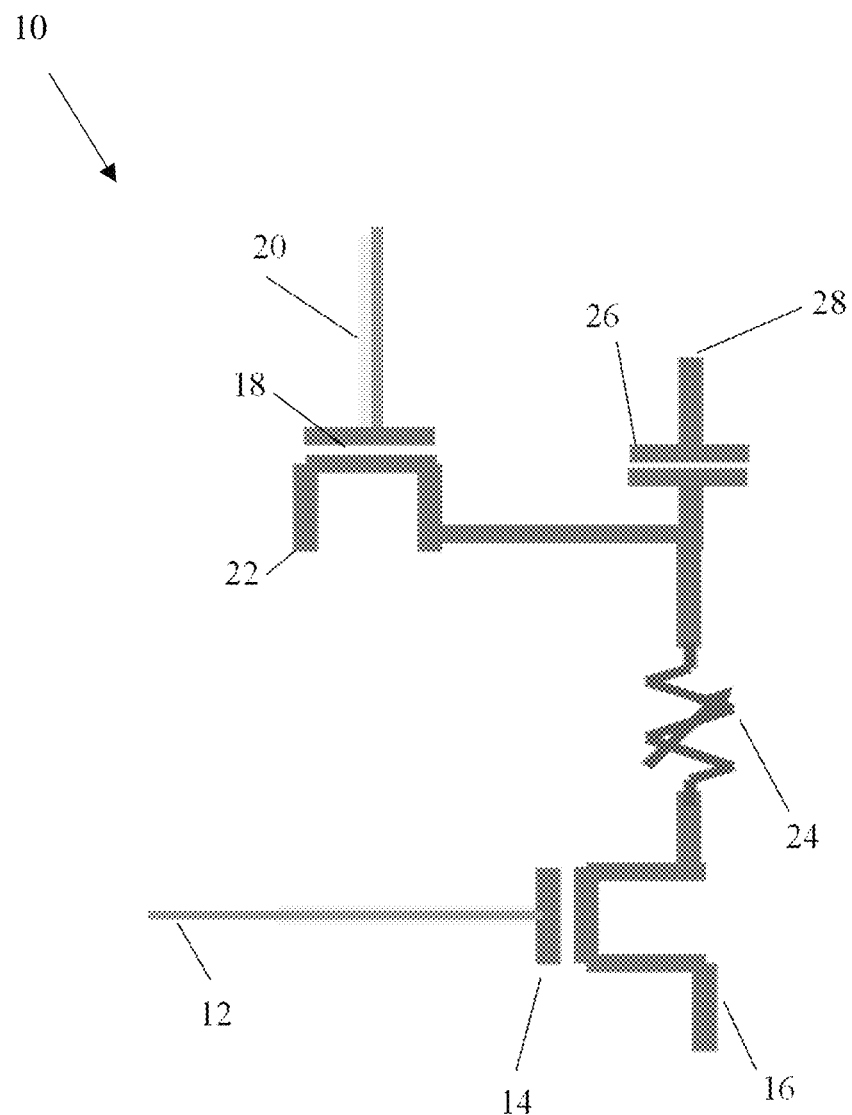
FIG. 1 shows a circuit of a memory cell with an integrated capacitor in accordance with aspects of the present disclosure.

FIG. 1 shows a circuit of a single memory cell with an integrated capacitor in accordance with aspects of the present disclosure. More specifically, the memory cell 10 includes a FET 14 connected between an Xi evaluation line 12 and a signal line 16. The memory cell 10 further includes a FET 18 connected between a wordline 20 and a bitline 22. In embodiments, the FETs 14, 18 may be NFETs. A memory element (RRAM) 24 may be connected in series with a capacitor 26. In embodiments, the capacitor 26 may be a RRAM structure, i.e., comprising an insulator material sandwiched between two metal plates. The capacitor 26, memory element 24, FET 14 and signal line 16 are in series. An output of the capacitor 26 is connected to a sum line 28.

Figure 2:
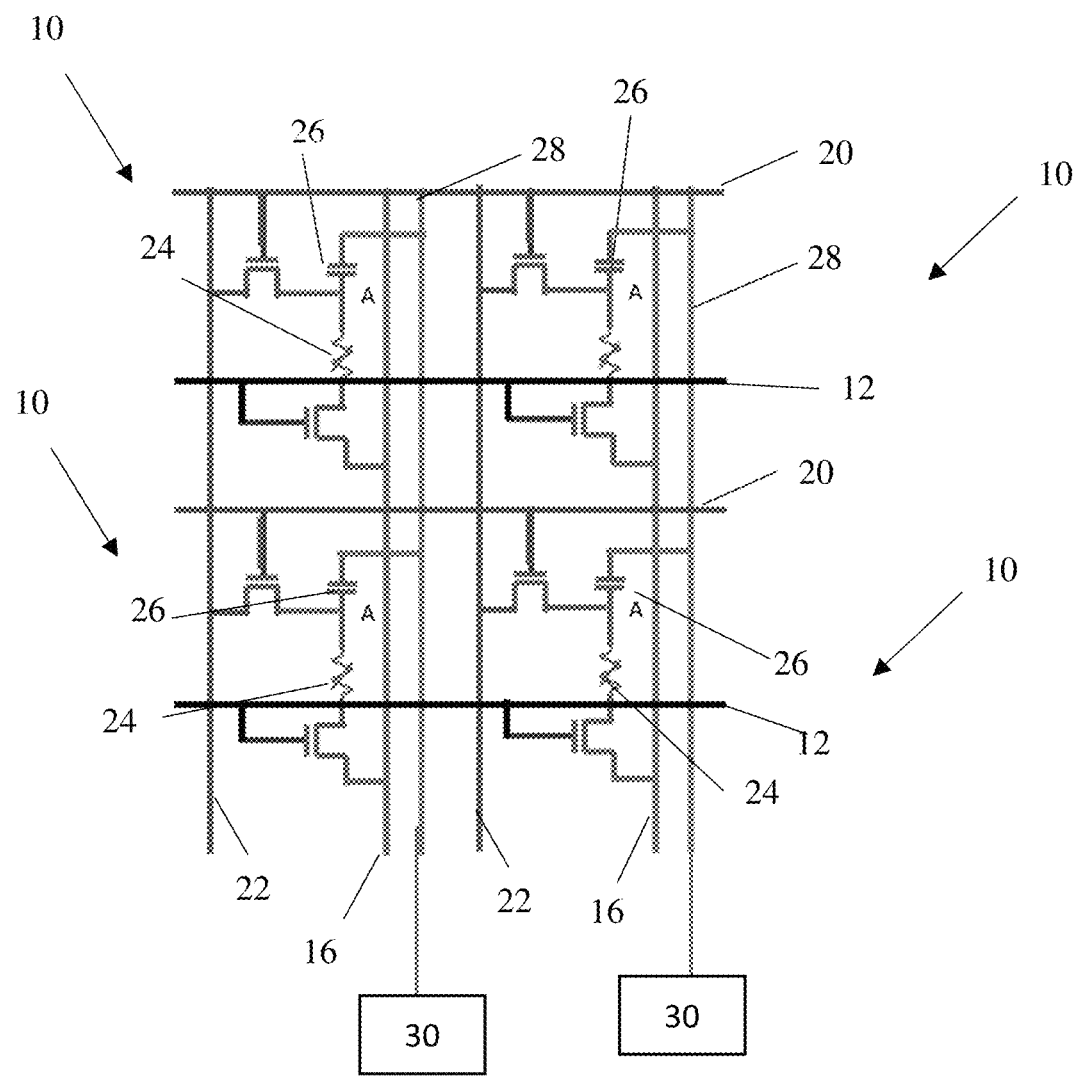
FIG. 2 shows multiple memory cells with integrated capacitors coupled to a single sum line in accordance with aspects of the present disclosure.

FIG. 2 shows an array of memory cells 10 arranged in columns, with each column sharing a common sum line 28. As should be recognized by those of skill in the art, in FIG. 2, a single wordline 20 and Xi evaluation line 12 may span across a plurality of columns, and may be used for adjacent memory cells 10 in each common row. Moreover, all activations amongst the multiple memory cells 10 in the memory array may be evaluated in parallel, and hence charge may be added/removed from the sum line 28 together for each memory cell 10 in the column as shown representatively in FIG. 2. An analog to digital converter 30 can evaluate the charge added/removed and turn it into a digital value.

As in each of the embodiments, it should be understood by those of skill in the art that for more variable or resistive based memories, the output of an ACiM bitcell is a signal proportional to Xi*Wi, where the signal is a certain amount of charge Qi removed/added to the sum line 28. Wi is the weight of each of the compute unit, in this case the "weight" will be the resistance value of the RRAM 24 element and it will be different for each of the cells 10. Also, in the capacitor coupled ACiM, the charge removed/added to the sum line 28 is a displacement current across the capacitor 26, so a dV/dt signal provided on the Xi evaluation line 12 is proportional to Xi*Wi (which is the equivalent of V*G (voltage×conductance of the RRAM element 24).

In a program mode, a voltage may be applied to the wordline 20, bitline 22 and Xi evaluation line 12 with the signal line 16 being placed at ground (GND). In embodiments, the voltage applied to the wordline 20 and Xi evaluation line 12 results in a write operation, and the voltage applied to the bitline 22 results in a program operation. In this operational stage, the sum line 28 is in a tristate (also referred to as HiZ or floating).

In an erase mode, voltage may be applied to the wordline 20, Xi evaluation line 12 and signal line 16, with the bitline 22 being placed at ground (GND). In embodiments, the voltage applied to the wordline 20 and Xi evaluation line 12 results in a write operation and the voltage applied to the signal line 16 results in an erase operation. In this operational stage, the sum line 28 is still in a tristate.

In an inference mode (e.g., evaluation), the wordline 20, bitline 22 and signal line 16 are placed at ground (GND), and the Xi evaluation line 12 is either pulse width or pulse height encoded (e.g., modulated). In this way, the "weight" (encoded as resistance value of the RRAM resistor) pulls its charge from the sum line 28 through the capacitor 26 and the analog digital converter 30 provided on the sum line 28 can change the summed analog signal to a digital signal. Also, in this operational stage, the voltage is fixed on the capacitor 26. Accordingly, in implementation, the RRAM element 24 stores analog weights, and the capacitor 26 provides a precise charge (current) to perform a summation.

In an alternative scenario, the signal line 16 may be used to encode the input signal and summed on the sum line 28. In this embodiment, the signal line 16 may be parallel to the Xi evaluation line 12.

Figure 3A:
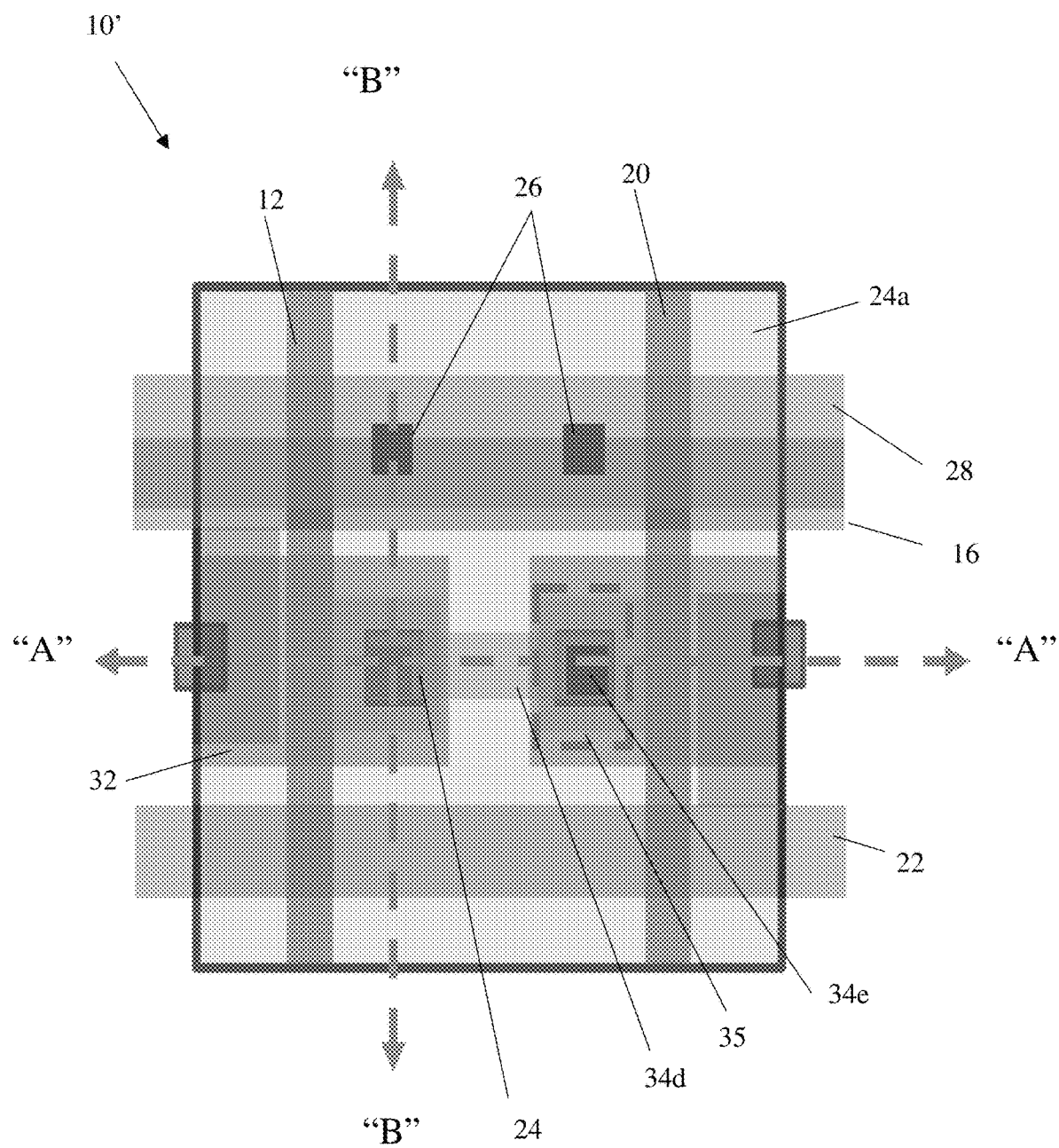
FIG. 3A shows a top view of an integrated memory cell in accordance with aspects of the present disclosure.
Figure 3B:
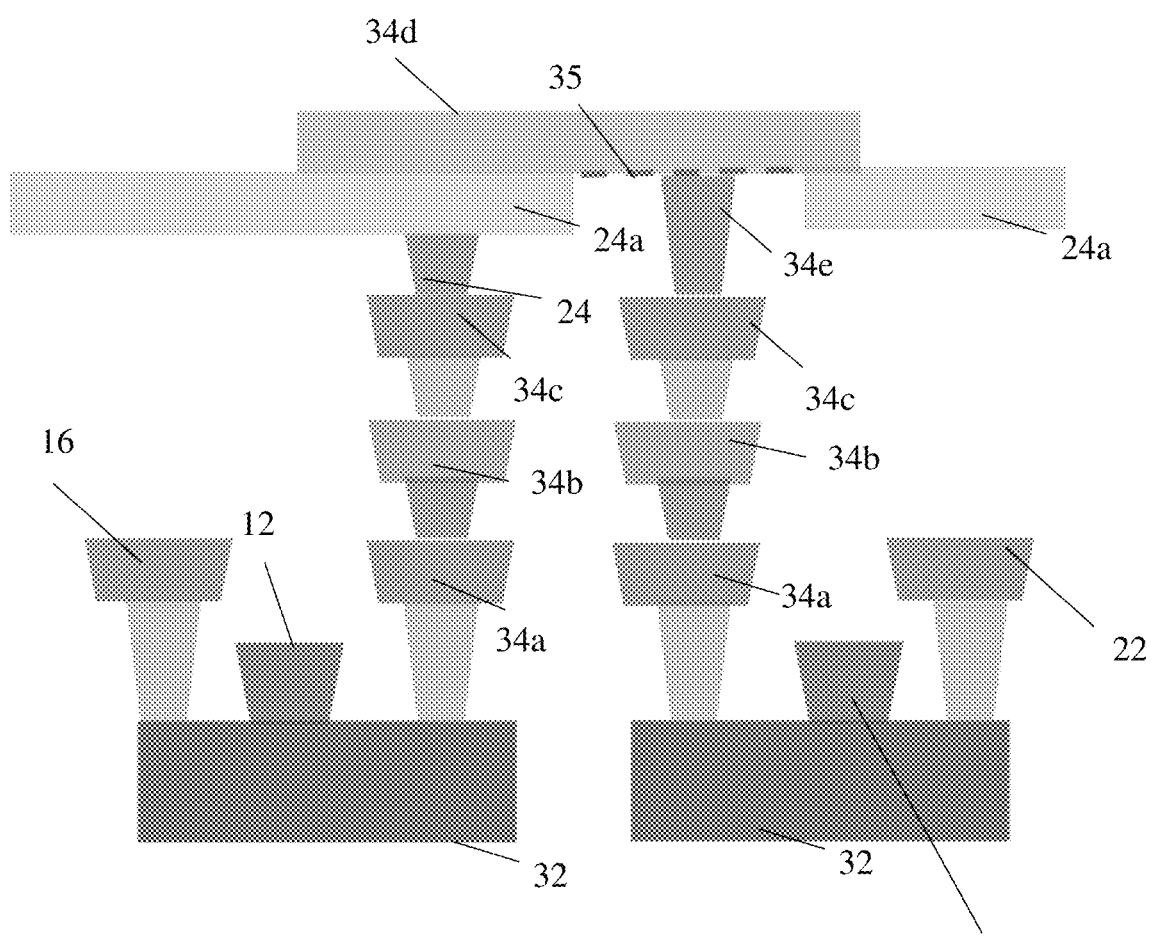
FIG. 3B shows a cross-section view of the integrated memory cell along line A-A of FIG. 3A.
Figure 3C:
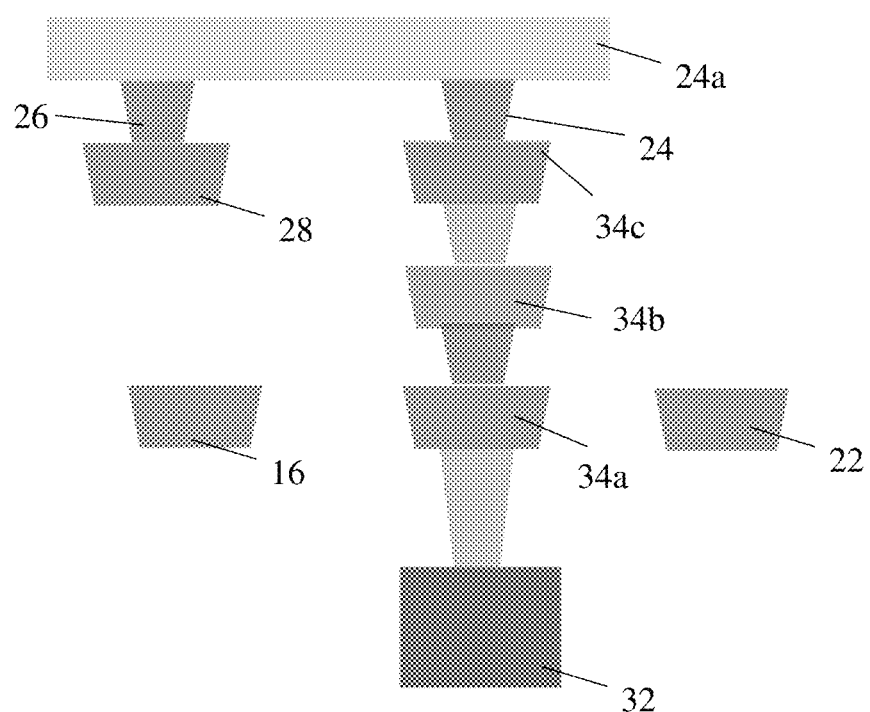
FIG. 3C shows a cross-section view of the integrated memory cell along line B-B of FIG. 3A.

FIG. 3A shows a top view of an integrated memory cell in accordance with aspects of the present disclosure. FIG. 3B shows a cross-sectional view along line A-A of the structure of FIG. 3A, and FIG. 3C shows a cross-sectional view along line B-B of the structure of FIG. 3A. More specifically and referring to FIGS. 3A-3C, the memory cell 10' is fabricated on a semiconductor substrate 32. In embodiments, the semiconductor substrate 32 may be composed of any suitable material including, but not limited to, Si, SiGe, SiGeC, SiC, GaAs, InAs, InP, and other III/V or II/VI compound semiconductors.

The memory cell 10' further includes the Xi evaluation line 12, signal line 16, wordline 20, bitline 22 and sum line 28. The lines 12, 16, 20, 22 and 28 may be metal lines fabricated using conventional lithography, etching and deposition methods as is known in the art such that no further explanation is required herein for a complete understanding of the present disclosure. In embodiments, the lines 12, 16, 20, 22 and 28 may be copper formed by an electroplating process, as an example. The lines 12, 20 may be on a first wiring level of the device, whereas the lines 16, 22 may be on another wiring level of the device. The sum line 28 may be provided on a different wiring level of the device, e.g., above the lines 12, 16, 20, 22 and at a same level as wiring layer 34c as shown in FIG. 3C.

Referring still to FIGS. 3A and 3C, the capacitors 26 (e.g., RRAM structures acting as capacitors) are electrically connected to the sum line 28 and the memory element 24, both in series. In embodiments, the capacitors 26 may be electrically connected to the memory element 24 using a top conductor (e.g., metal) material 24a of the memory element 24. And as discussed in more detail herein, the top conductor material 24a of the memory element 24 may be the top plate of the capacitor 26. In this way, the capacitors 26, sum line 28 and memory element 24 are electrically connected in series. Also, by using the top conductor material 24a of the memory element 24, it is possible to have a seamless integration of the capacitor 26 in electrical connection with the memory element 24 (at a same level of the device). It should be understood by those of skill in the art that the capacitors 26 can be sized differently than the memory elements (e.g., resistance element) 24.

As shown further in FIGS. 3A and 3B (or FIG. 1), the memory elements 24 may be multiple memory elements (e.g., RRAM) in an array of cells. The memory elements 24 may comprise an insulator material, e.g., $SiO_2$, $Al_2O_3$, $Ta_2O_5$ and other insulators generally used in RRAM devices, between a bottom conductor (e.g., metal) material and the top conductor material 24a. In embodiments, the top conductor material 24a may be TaSi or TaN or TiN, which connects to and makes part of the capacitor 26 to fully integrate the capacitors 26 with the memory elements 24. For example, the top conductor material 24a may be a top plate of the capacitor 26, as both the capacitor 26 and memory element 24 may be RRAM structures.

More specifically, as the capacitors 26 and the memory elements 24 may both be RRAM structures, it is contemplated herein that the bottom plate of the capacitor comprises the same material as the bottom conductor material of the memory element and, similarly, the top conductor material 24a may be a top plate of the capacitor 26. Moreover, the insulator material of the capacitor 26 may be the same material as the insulator material of the memory element, e.g., $SiO_2$. In this way, the capacitors 26 and the memory elements 24 may be fabricated in the same processing steps, e.g., deposition and patterning steps. Also, in this way, the layout seamlessly integrates the RRAM (e.g., memory element 24), capacitor 26 and drive transistors into one compact element.

Metal wiring layers (and via interconnects) 34a, 34b, 34c may electrically connect the memory element 24 (e.g., top conductor material 24a) to the substrate 32. That is, the memory elements 24 may be electrically connected to the substrate 32 (e.g., diffusions) by multiple metal layers (and interconnects) 34a, 34b, 34c. An upper metal wiring layer 34d connects to the top conductor material 24a, in addition to connecting to metal wiring layer 34c (e.g., which in turn connects to metal wiring layers 34a, 34b and substrate 32) using a via interconnect 34e extending through an opening 35 in the top conductor material 24a.

In embodiments, the memory elements 24 may be at any metal layer connecting to the underlying semiconductor substrate 32 (or diffusion of the underlying semiconductor substrate 32) through different metal layers 34a, 34b, 34c (and respective vias or interconnects). In embodiments, the different metal layers 34a, 34b, 34c may comprise copper; although other conductive materials are also contemplated herein. In embodiments, the lines 16, 32 may be composed of a same metal material and may be on a same metal layer as one of the metal layers, e.g., metal layer 34a (metal layer 1). In addition, the capacitors 26 and the memory elements 24 may be on the same level of the structure, with the top conductor material 24a being a top plate of the capacitor 26.

Figure 4:
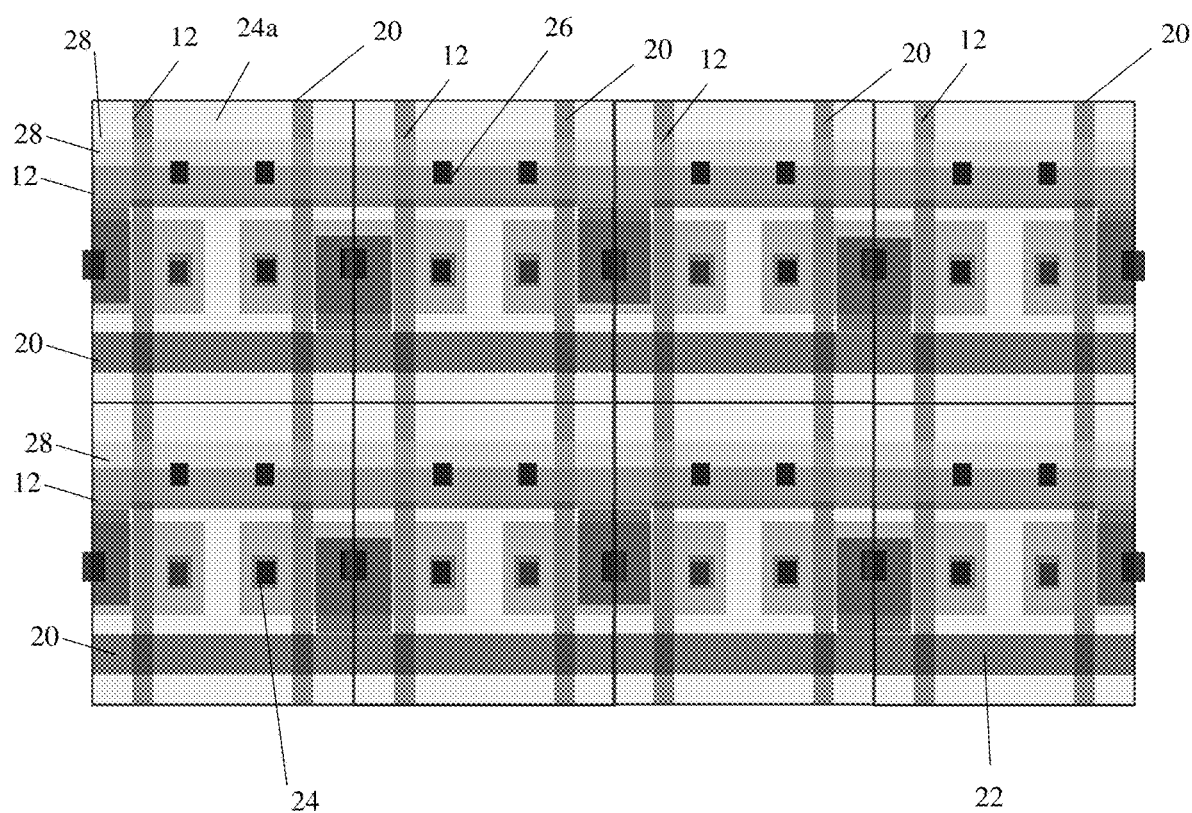
FIG. 4 shows an array of memory cells integrated with capacitors and coupled to sum lines in accordance with aspects of the present disclosure.

FIG. 4 shows an array of memory cells in accordance with aspects of the present invention. As shown an FIG. 4, for example, each cell in a column shares a common sum line 28. In addition, and as described with respect to FIG. 2, a single wordline 20 and Xi evaluation line 12 may span across a plurality of columns and may be used for adjacent memory cells 10 in each row. Moreover, all activations amongst the multiple memory cells in the array may be evaluated in parallel, and hence charge may be added/removed from the sum line together for each cell in the column. In addition, the top metal layer 24 of the RRAM (e.g., memory element 24) electrically connects to the capacitor 26, hence providing an integrated memory cell with a capacitor 26 and drive logic (e.g., FETs).

The memory cells can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   at least one memory cell comprising a memory element with a top conductor material;
   a capacitor connected to the memory element by the top conductor material; and
   an upper wiring layer connecting to a substrate through an opening in the top conductor material.

2. The structure of claim 1, further comprising a sum line in series with the capacitor.

3. The structure of claim 2, wherein the sum line is common to multiple memory cells in a memory array.

4. The structure of claim 1, wherein the memory element comprises a resistive random-access memory.

5. The structure of claim 1, wherein the top conductor material comprises one of TaSi, TaN and TiN.

6. The structure of claim 1, wherein the top conductor material comprises a top plate of the capacitor.

7. The structure of claim 6, wherein the capacitor is sized differently than the memory element.

8. The structure of claim 1, wherein the memory element comprises the top conductor material, a bottom conductor material and an insulator material between the top conductor material and the bottom conductor material.

9. The structure of claim 8, wherein the bottom conductor material of the memory element comprises a bottom plate of the capacitor, the insulator material of the memory element comprises an insulator layer of the capacitor and the top conductor material of the memory element comprises a top plate of the capacitor.

10. The structure of claim 1, wherein the memory element and the capacitor are connected in series through the top conductor material.

11. A structure comprising:
    an array of memory cells each of which comprises a resistive memory element with a top conductive material and a capacitor connected to the resistive memory element by the top conductive material; and
    a sum line connecting to each capacitor in the array of memory cells.

12. The structure of claim 11, wherein the memory cell comprises a resistive random-access memory.

13. The structure of claim 11, wherein the capacitor is sized differently than the memory element.

14. The structure of claim 11, wherein the sum line is a common sum line connected to each capacitor in the array of memory cells.

15. The structure of claim 11, wherein the sum line connects to an analog to digital converter.

16. The structure of claim 11, wherein the top conductive material comprises TaSi.

17. The structure of claim 11, wherein the resistive memory element is provided on a same wiring level as the capacitor.

18. The structure of claim 17, wherein the top conductive material of the resistive memory element comprises a top plate of the capacitor.

19. A method comprises:
    forming at least one memory cell comprising a memory element with a top conductor material;

forming a capacitor connected to the memory element by the top conductor material; and forming an upper wiring layer connecting to a substrate through an opening in the top conductor material.

* * * * *